US010524364B2

(12) United States Patent
Henckens

(10) Patent No.: US 10,524,364 B2
(45) Date of Patent: Dec. 31, 2019

(54) ELECTRICALLY CONDUCTIVE ADHESIVES

(75) Inventor: Anja Henckens, Zonhoven (BE)

(73) Assignee: HENKEL AG & CO. KGAA, Duesseldorf (DE)

( * ) Notice: Subject to any disclaimer, the term of this patent is extended or adjusted under 35 U.S.C. 154(b) by 0 days.

(21) Appl. No.: 13/344,649

(22) Filed: Jan. 6, 2012

(65) Prior Publication Data
US 2012/0177930 A1    Jul. 12, 2012

Related U.S. Application Data

(63) Continuation of application No. PCT/EP2010/059746, filed on Jul. 7, 2010.

(30) Foreign Application Priority Data

Jul. 8, 2009 (EP) ..................................... 09164912

(51) Int. Cl.
H05K 3/22 (2006.01)
H01B 1/22 (2006.01)
C09J 9/02 (2006.01)
H05K 3/32 (2006.01)
B32B 5/16 (2006.01)
C08K 3/02 (2006.01)
C09J 163/00 (2006.01)
C08K 3/08 (2006.01)
B32B 27/38 (2006.01)

(52) U.S. Cl.
CPC ............... H05K 3/321 (2013.01); C09J 9/02 (2013.01); H01B 1/22 (2013.01); B32B 5/16 (2013.01); B32B 27/38 (2013.01); B32B 2305/30 (2013.01); B32B 2307/202 (2013.01); B32B 2311/08 (2013.01); B32B 2405/00 (2013.01); B32B 2457/12 (2013.01); C08K 3/02 (2013.01); C08K 2003/0806 (2013.01); C09J 163/00 (2013.01); C09J 2400/16 (2013.01); H05K 2203/0425 (2013.01); Y10T 428/31515 (2015.04)

(58) Field of Classification Search
CPC ....... B32B 5/16; B32B 27/38; B32B 2305/30; B32B 2307/202; B32B 2311/08; B32B 2405/00; B32B 2457/12; C08K 3/02; C08K 2003/0806; C09J 9/02; C09J 163/00; C09J 2400/16; H05K 2203/0425; H05K 3/321; H01B 1/22; Y10T 428/31515
See application file for complete search history.

(56) References Cited

U.S. PATENT DOCUMENTS

| 4,419,496 | A | | 12/1983 | Henton et al. |
| 4,778,851 | A | | 10/1988 | Henton et al. |
| 4,999,699 | A | * | 3/1991 | Christie ............... H01L 21/563 228/175 |
| 5,084,107 | A | * | 1/1992 | Deguchi ......... H01L 31/022425 136/256 |
| 5,463,190 | A | * | 10/1995 | Carson ..................... H01R 4/04 174/256 |
| 5,516,418 | A | * | 5/1996 | Doss ....................... C25D 5/024 205/119 |
| 5,667,884 | A | * | 9/1997 | Bolger .......................... 428/323 |
| 5,733,954 | A | | 3/1998 | McKenzie et al. |
| 5,789,498 | A | | 8/1998 | Ohnishi et al. |
| 5,798,399 | A | | 8/1998 | Griggs et al. |
| 5,801,218 | A | | 9/1998 | McKenzie et al. |
| 5,855,821 | A | | 1/1999 | Chau et al. |
| 5,981,659 | A | | 11/1999 | Geck et al. |
| 6,111,015 | A | | 8/2000 | Eldin et al. |
| 6,147,142 | A | | 11/2000 | Geck et al. |
| 6,180,693 | B1 | | 1/2001 | Tang et al. |
| 6,344,157 | B1 | | 2/2002 | Cheng et al. |
| 6,791,839 | B2 | * | 9/2004 | Bhagwagar ................... 361/705 |
| 2007/0185243 | A1 | | 8/2007 | Terada et al. |
| 2008/0196757 | A1 | * | 8/2008 | Yoshimine ...... H01L 31/022425 136/244 |
| 2010/0210793 | A1 | * | 8/2010 | Ogawa ................. C08G 59/184 525/423 |

FOREIGN PATENT DOCUMENTS

| EP | 1032038 | A2 | | 8/2000 | |
| GB | 1203576 | A | * | 8/1970 | ........... C08K 5/3412 |
| JP | H09059586 | A | | 3/1997 | |
| JP | 09-279121 | A | | 10/1997 | |
| JP | H09279121 | A | | 10/1997 | |
| JP | 2001085824 | A | | 3/2001 | |
| JP | 2002265920 | A | | 9/2002 | |
| JP | 2003138244 | A | | 5/2003 | |
| JP | 2003147306 | A | | 5/2003 | |
| JP | 2005126658 | A | | 5/2005 | |
| JP | 2006225426 | A | | 8/2006 | |

(Continued)

OTHER PUBLICATIONS

Hollemann, Arnold F. et al. Lehrbuch der anorganischen Chemie. Holleman-Wiberg, Walter de Gruyter & Co., 101 edition, 1995.

Primary Examiner — John D Freeman
(74) Attorney, Agent, or Firm — Steven C. Bauman

(57) ABSTRACT

The present invention relates to adhesives that are suitable for use as electrically conductive materials in the fabrication of electronic devices, integrated circuits, semiconductor devices, solar cells and/or solar modules. The adhesives comprise at least one resin component, at least one nitrogen-containing curative, at least one low melting point metal filler, and optionally at least one electrically conductive filler, which is different from the metal filler.

10 Claims, No Drawings

(56) References Cited

FOREIGN PATENT DOCUMENTS

| | | |
|---|---|---|
| JP | 2009517498 A | 4/2009 |
| JP | 2010209207 A | 9/2010 |
| WO | 9301248 A1 | 1/1993 |
| WO | 2009044801 A1 | 4/2009 |
| WO | WO 2009047885 A1 * | 4/2009 ........... C08G 59/184 |

* cited by examiner

ELECTRICALLY CONDUCTIVE ADHESIVES

CROSS REFERENCE TO RELATED APPLICATIONS

This application is a continuation of International Patent Application No. PCT/EP2010/059746 filed Jul. 7, 2010, which claims priority to European Patent Application No. 09164912.9 filed Jul. 8, 2009, both of which are incorporated herein by reference.

FIELD OF INVENTION

The present invention relates to adhesives that are suitable for use as electrically conductive materials in the fabrication of electronic devices, integrated circuits, semiconductor devices, solar cells and/or solar modules. The adhesives comprise at least one resin component, at least one nitrogen-containing curative, at least one low melting point metal filler, and optionally at least one electrically conductive filler, which is different from the metal filler.

BACKGROUND OF THE INVENTION

Electrically conductive materials are used for a variety of purposes in the fabrication and assembly of electronic devices, integrated circuits, semiconductor devices, and solar cells and/or solar modules. For example, electrically conductive adhesives are used to bond integrated circuit chips to substrates (die attach adhesives) or metal tabs to the surfaces of solar cells.

For a broad variety of different applications electrically conductive materials, such as electrically conductive adhesives (ECAs), can be regarded as a promising alternative to solder materials as interconnect materials. In general, ECAs provide a mechanical bond between two surfaces and conduct electricity. Typically, ECA formulations are made of a polymer resin filled with electrically conductive metal fillers. The resin generally provides a mechanical bond between two substrates, while the electrically conductive fillers generally provide the desired electrical interconnection. Typically, ECAs offer the following advantages: lower processing temperatures, reduced environmental impact, and increased resistance to thermomechanical fatigue.

For instance, U.S. Pat. No. 6,344,157 B1 discloses an electrically conductive adhesive with improved electrical stability for use in microelectronic applications, which comprises a polymeric resin, a conductive filler, a corrosion inhibitor, and a low melting point metal filler, wherein the low melting point metal filler can be selected from indium, indium alloys, tin alloys or mixtures thereof. The polymeric resin can be selected from the group consisting of vinyl-, acrylic-, phenol-, epoxy-, maleimide-, polyimide-, or silicon-containing resins. The above referenced U.S. patent does not disclose the combination of cyanate esters and epoxy resins as the polymeric resin component.

While conductive adhesives having conductive fillers may have potential advantages in electrical conduction applications, they may also pose challenges, such as the relatively low electrical conductivity of the polymeric portion of the adhesive. Moreover, a particular challenge with metal-filled adhesives is implementing the appropriate balance of filler loading, adhesive strength, curing speed, electrical conductivity and stable electrical contact resistance.

Hence there is a need for new adhesives having electrically conducting properties in order to achieve the desired adhesion, curing speed, electrical conductivity and stable electrical contact resistance.

SUMMARY OF THE INVENTION

The present invention provides an adhesive and the cured product of said adhesive, both of which have electrically conducting properties. The adhesive of the present can be cured in about 0.1 s to 100 minutes at a temperature within the range of about 50° C. to about 220° C. When cured, the cured product exhibits a good adhesion, a stable electrical contact resistance and a high electrical conductivity.

The adhesive of the present invention comprises:
a) at least one resin component, comprising
   i) at least one cyanate ester component, and
   ii) at least one epoxy resin;
b) at least one nitrogen-containing curative;
c) at least one metal filler, which has a melting point of less than 300° C. at 1013 mbar; and
d) optionally, at least one electrically conductive filler, which is different from the metal filler.

The adhesive of the present invention is capable of forming an electrically conductive bond between two substrates and can be used in the fabrication and assembly of electronic devices, integrated circuits, semiconductor devices, solar cells and/or solar modules.

Therefore, the invention also provides a bonded assembly comprising two substrates aligned in a spaced apart relationship, each of which having an inwardly facing surface and an outwardly facing surface, wherein between the inwardly facing surfaces of each of the two substrates an electrically conductive bond is formed by the cured product of the adhesive of the present invention.

Another aspect of the present invention relates to the use of the adhesive of the present invention in the fabrication of electronic devices, integrated circuits, semiconductor devices, solar cells and/or solar modules.

DETAILED DESCRIPTION OF THE INVENTION

The term "electrically conductive filler" as used in the present invention refers to a material, which when added to a nonconductive resin component produces an electrically conductive polymer composite. Electrically conductive fillers are distinct from the metal fillers, which have a melting point of less than 300° C. at 1013 mbar.

The term "solar module" as used in the present invention refers to an arrangement of several interconnected solar cells, such as an arrangement of several electrically interconnected solar cells. As will be used herein, the term "solar module" includes solar modules, solar panels and solar arrays.

The term "resin component" refers to all polymerizable resins and reactive diluents that are present in the adhesive of the present invention. In a particular preferred embodiment all resin components of the adhesive of the present invention are selected from the group consisting of cyanate ester components and epoxy resins. In an alternative embodiment the adhesive of the present invention comprises at least one additional resin component, preferably selected from vinyl-, acrylic-, phenol-, maleimide-, polyimide-, or silicon-containing resins and combinations thereof.

In one embodiment of the present invention the cyanate ester component is selected from polyfunctional monomeric cyanates, polyfunctional polymeric cyanates, and combinations thereof.

The term "polyfunctional" refers to monomeric or polymeric cyanate esters that have at least two cyanate groups. These compounds are preferably selected from compounds having the following structures (I) to (IV):

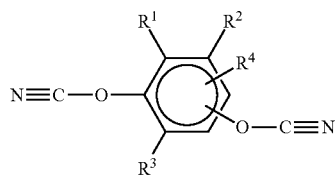
(I)

wherein $R^1$ to $R^4$ are independently from each other hydrogen, $C_1$-$C_{10}$ alkyl, $C_3$-$C_8$ cycloalkyl, $C_1$-$C_{10}$ alkoxy, halogen, phenyl or phenoxy, the alkyl or aryl groups optionally being partly or fully fluorinated. Examples are phenylene-1,3-dicyanate, phenylene-1,4-dicyanate, 2,4,5-trifluorophenylene-1,3-dicyanate;

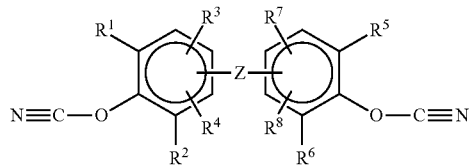
(II)

wherein $R^5$ to $R^8$ are defined as $R^1$ to $R^4$ and Z is a chemical bond, $SO_2$, $CF_2$, $CH_2$, CHF, $CH(CH_3)$, $C(CH_3)_2$, $C(CF_3)_2$, $C_1$-$C_{10}$ alkyl, O, NH, N=N, CH=CH, COO, CH=N, CH=N—N=CH, alkyloxyalkyl having a $C_1$-$C_8$ alkyl group, S, $Si(CH_3)_2$ or

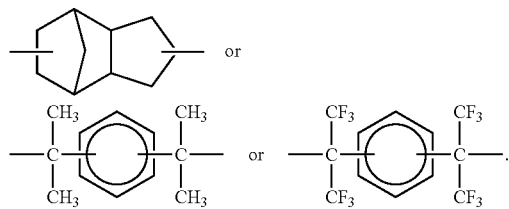

Examples are 2,2-bis(4-cyanato-phenyl)propane, 2,2-bis(4-cyanato-phenyl)hexafluoropropane, biphenylene-4,4'-dicyanate;

(III)

wherein $R^{10}$ is a two-binding non-aromatic hydrocarbon having 3 to 100 carbon atoms. The hydrocarbon chain can be substituted with one or more substituent(s) preferably selected from halogen, such as fluorine, hydroxyl, acyl, and amino;

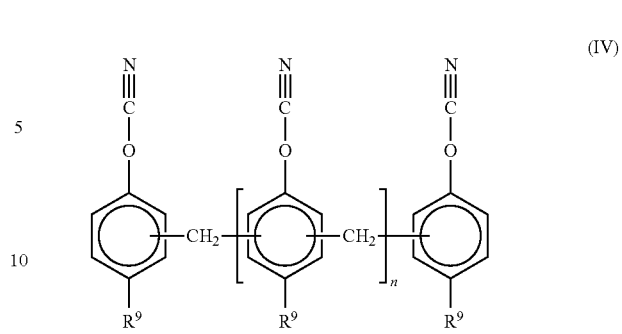
(IV)

wherein $R^9$ is hydrogen or $C_1$-$C_{10}$ alkyl and n is an integer from 0 to 20.

The polyfunctional monomeric cyanates and polyfunctional polymeric cyanates may be used as monomers or prepolymers, alone or in mixture with each other or in mixture with one or more monofunctional cyanates.

Preferred monofunctional cyanates are selected from compounds having the following structures (V) or (VI),

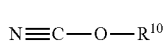
(V)

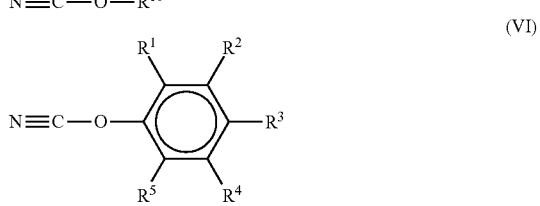
(VI)

wherein $R^1$ to $R^5$ and $R^{10}$ are defined as above.

The properties of the cured resin components, for example the glass transition temperature, can be manipulated by way of copolymerization of polyfunctional monomeric and/or polymeric cyanates with monofunctional cyanates, wherein the preferred amount of cyanate radicals of monofunctional cyanates being up to 50 mol-%, preferably up to 40 mol-% and more preferably up to 10 mol-%, in relation to all cyanate radicals of the adhesive of the present invention.

Among the commercially available cyanate ester components suitable for use in the present invention are bisphenol-A cyanate esters, hexafluorobisphenol-A cyanate esters, bisphenol-E cyanate esters, tetramethylbisphenol-F cyanate esters, bisphenol-M cyanate esters, phenol novolac cyanate esters, dicyclopentadienyl-bisphenol cyanate esters, novolac cyanate esters, such as those commercially available under the tradenames Primaset, like Primaset PT15, Primaset PT30, Primaset PT60, Primaset BADCy, Primaset LECy, Primaset METHYLCy, Primaset BA200 from Lonza and AroCy, like AroCy B-10, AroCy F-10, and AroCy L-10 from Huntsman.

The cyanate ester component or mixtures of different cyanate ester components can be used in an amount from 4 to 70 percent by weight, more preferably from 20 to 60 percent by weight and most preferably in an amount from 30 to 50 percent by weight, based on the total weight of all resin components of the inventive adhesive.

The adhesive of the present invention further comprises at least one epoxy resin, i.e. epoxy-containing compound. Commercially available epoxy resins for use in the present invention are illustrated below.

The resin used may include multifunctional epoxy-containing compounds, such as glycidyl ethers of $C_2$-$C_{28}$ diols, $C_1$-$C_{28}$ alkyl-, poly-phenol glycidyl ethers; polyglycidyl ethers of pyrocatechol, resorcinol, hydroquinone, 4,4'-dihydroxydiphenyl methane (or bisphenol F, such as RE-303-S or RE-404-S available commercially from Nippon Kayuku, Japan), 4,4'-dihydroxy-3,3'-dimethyldiphenyl methane, 4,4'-dihydroxydiphenyl dimethyl methane (or bisphenol A), 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphenyl)methane; polyglycidyl ethers of transition metal complexes; chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; phenol novolac epoxy; cresol novolac epoxy; and combinations thereof.

Among the commercially available epoxy resins suitable for use in the present invention are polyglycidyl derivatives of phenolic compounds, such as those available under the tradenames EPON 825, EPON 826, EPON 828, EPON 1001, EPON 1007 and EPON 1009, cycloaliphatic epoxy-containing compounds such as Araldite CY179 from Huntsman or waterborne dispersions under the tradenames EPI-REZ 3510, EPI-REZ 3515, EPI-REZ 3520, EPI-REZ 3522, EPI-REZ 3540 or EPI-REZ 3546 from Hexion; DER 331, DER 332, DER 383, DER 354, and DER 542 from Dow Chemical Co.; GY285 from Huntsman, Inc.; and BREN-S from Nippon Kayuku, Japan. Other suitable epoxy-containing compounds include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company and a waterborne dispersion ARALDITE PZ 323 from Huntsman.

Cresol analogs are also available commercially such as ECN 1273, ECN 1280, ECN 1285, and ECN 1299 or waterborne dispersions ARALDITE ECN 1400 from Huntsman, Inc. SU-8 and EPI-REZ 5003 are bisphenol A-type epoxy novolacs available from Hexion. Epoxy or phenoxy functional modifiers to improve adhesion, flexibility and toughness, such as the HELOXY brand epoxy modifiers 67, 71, 84, and 505. When used, the epoxy or phenoxy functional modifiers may be used in an amount of about 1:1 to about 5:1 with regard to the heat curable resin.

Combinations of the different epoxy resins (epoxy-containing compounds) are also desirable for use herein.

The epoxy resin or mixtures of different epoxy resins can be used in an amount from 30 to 96 percent by weight, more preferably from 40 to 80 percent by weight, and most preferably from 50 to 70 percent by weight, based on the total weight of all resin components of the present invention.

Preferably the cyanate ester component is present in an amount from 4 to 70 percent by weight, more preferably in an amount from 20 to 60 percent by weight or 30 to 50 percent by weight, based on the total weight of all resin components of the adhesive of the present invention and the epoxy resin is present in an amount from 30 to 96 percent by weight, and more preferably in an amount from 40 to 80 percent by weight or 50 to 70 percent by weight, based on the total weight of all resin components of the adhesive of the present invention.

By using mixtures of cyanate ester components and epoxy resins, adhesives can be formulated which exhibit a much higher curing speed (at relatively low temperatures) than comparable epoxy-based formulations. Additionally the inventive adhesives provide a higher electrical conductivity and a more stable electrical contact resistance than the aforementioned epoxy-based formulations.

In a particular preferred embodiment the total weight of all resin components of the inventive adhesive is in the range of 3 to 25 percent by weight, preferably in the range of 5 to 18 percent by weight, and more preferably in the range of 6 to 15 percent by weight, based on the total weight of the inventive adhesive.

In another embodiment the adhesive of the present invention additionally comprises core shell rubber particles.

Such particles generally have a core comprising a polymeric material having elastomeric or rubbery properties (i.e., a glass transition temperature less than about 0° C., e.g., less than about −30° C.) surrounded by a shell comprising of a non-elastomeric polymeric material (i.e., a thermoplastic or thermoset/crosslinked polymer having a glass transition temperature greater than ambient temperatures, e.g., greater than about 50° C.).

For example, the core may comprise of a diene homopolymer or copolymer (for example, a homopolymer of butadiene or isoprene, a copolymer of butadiene or isoprene with one or more ethylenically unsaturated monomers such as vinyl aromatic monomers, (meth)acrylonitrile, (meth)acrylates, or the like) while the shell may comprise a polymer or copolymer of one or more monomers such as (meth)acrylates (e.g., methyl methacrylate), vinyl aromatic monomers (e.g., styrene), vinyl cyanides (e.g., acrylonitrile), unsaturated acids and anhydrides (e.g., acrylic acid), (meth)acrylamides, and the like having a suitably high glass transition temperature. Other rubbery polymers may also be suitably be used for the core, including polybutylacrylate or polysiloxane elastomer (e.g., polydimethylsiloxane, particularly crosslinked polydimethylsiloxane). The core shell rubber particles may comprise more than two layers (e.g., a central core of one rubbery material may be surrounded by a second core of a different rubbery material or the rubbery core may be surrounded by two shells of different composition or the core shell rubber particles may have the structure soft core, hard shell, soft shell, hard shell). In one embodiment of the invention, the core shell rubber particles comprise a core and at least two concentric shells having different chemical compositions and/or properties.

Either the core or the shell or both the core and the shell may be crosslinked (e.g., ionically or covalently). The shell may be grafted onto the core. The polymer comprising the shell may bear one or more different types of functional groups (e.g., epoxy groups) that are capable of interacting with other components of the adhesive of the present invention.

Typically, the core will comprise from about 50 to about 95 percent by weight of the core shell rubber particles while the shell will comprise from about 5 to about 50 percent by weight of the core shell rubber particles.

The core shell rubber particles may be on the nano scale size. That is, the core shell rubber particles have an average diameter of less than about 1000 nm, preferably less than about 400 nm, and more preferably less than about 350 nm, desirably in the range of 50 to 350 nm.

Methods of preparing rubber particles having a core-shell structure are well-known in the art and are described, for example, in U.S. Pat. Nos. 4,419,496, 4,778,851, 5,981,659, 6,111,015, 6,147,142 and 6,180,693, each of which being incorporated herein by reference in its entirety.

Rubber particles having a core-shell structure may be prepared as a masterbatch where the rubber particles are dispersed in one or more resins, such as a diglycidyl ether of bisphenol A. For example, the rubber particles typically are prepared as aqueous dispersions or emulsions. Such dispersions or emulsions may be combined with the desired resin or mixture of different resins and the water and other volatile substances removed by distillation or the like.

Particularly suitable dispersions of rubber particles having a core-shell structure in an epoxy resin are available from Kaneka Corporation or Hanse Chemie, such as Kaneka MX-120 (masterbatch of 25 weight % nano-sized core-shell rubber in a diglycidyl ether of bisphenol A matrix), Kaneka MX-136 (masterbatch of 25 weight % nano-sized core-shell rubber in a diglycidyl ether of bisphenol F matrix), and Hanse Chemie Albidur EP 940.

For instance, the core may be formed predominantly from feed stocks of polybutadiene, polyacrylate, polybutadiene/acrylonitrile mixture, polyols and/or polysiloxanes or any other monomers that give a low glass transition temperature. The outer shells may be formed predominantly from feed stocks of polymethylmethacrylate, polystyrene or polyvinyl chloride or any other monomers that give a higher glass transition temperature. The core shell rubber particles made in this way may be dispersed in an epoxy resin.

The core shell rubber particles may be present in the adhesive of the present invention in an amount in the range of about 5 to about 45 parts per weight, preferably in the range of about 10 to about 30 parts per weight, based on the total weight of all resin components of the inventive adhesive.

By using core shell rubber particles the toughness and peel adhesion of the cured products of the adhesives of the present invention is increased without lowering the glass transition temperature of the cured products of the adhesives of the present invention.

The nitrogen-containing curative allows the adhesive of the present invention to cure under appropriate conditions, wherein said curative can be selected from compounds having at least one amino group, such as primary or secondary amino groups.

In one embodiment of the present invention the nitrogen-containing curative is selected from primary or secondary amines which show blocked or decreased reactivity. The definition "primary or secondary amines that show blocked or decreased reactivity" shall mean those amines which due to a chemical or physical blocking are incapable or only have very low capability to react with the resin components, but may regenerate their reactivity without reacting with a chemical reactant which would cleave a protective group. These properties may be inherent to the amines due to physical or chemical conditions.

Primary or secondary amines that show blocked or decreased reactivity can be chemically or physically encapsulated. After liberation of the amine, e.g. by melting it at increased temperatures, by removing sheath or coatings, by the action of pressure or of supersonic waves or of other energy types, the curing reaction of the resin components starts.

In a preferred embodiment of the present invention the nitrogen-containing curative is selected from heat activatable curatives.

Examples of heat activatable curatives are guanidines, substituted guanidines, substituted ureas, melamine resins, guanamine derivatives, cyclic tertiary amines, aromatic amines and/or mixtures thereof.

Preferred nitrogen-containing and/or heat activatable curatives are selected from amine-epoxy adducts. Amine-epoxy adducts are well-known in the art and are described, for example, in U.S. Pat. Nos. 5,733,954, 5,789,498, 5,798, 399 and 5,801,218, each of which is incorporated herein by reference in its entirety. Such amine-epoxy adducts are the products of the reaction between one or more amine compound(s) and one or more epoxy compound(s). Carboxylic acid anhydrides, carboxylic acids, phenolic novolac resins, water, metal salts and the like may also be utilized as additional reactants in the preparation of the amine-epoxy adduct or to further modify the adduct once the amine and epoxy have been reacted.

Preferably, the adduct is a solid that is insoluble in the resin components of the present invention at room temperature, but that becomes soluble or melts upon heating and functions as a curative (hardener) to cure the resin components. While any type of amine could be used, heterocyclic amines, amines containing at least one secondary nitrogen, and imidazole compounds are preferred.

Illustrative imidazoles include 2-methyl imidazole, 2,4-dimethyl imidazole, 2-ethyl-4-methyl imidazole, 2-phenyl imidazole and the like. Other suitable amines include, but are not limited to, piperazines, piperidines, pyrazoles, purines, and triazoles. Any kind of epoxy resin can be employed as the other starting material for the adduct, including monofunctional, bifunctional, and polyfunctional epoxy compounds, such as those described previously with regard to the epoxy resin.

Suitable amine-epoxy adducts are available from commercial sources such as Ajinomoto, Inc., Air products, Adeka, Asahi Denka Kogyo K. K., and the Asahi Chemical Industry Company Limited. The products sold by Ajinomoto under the trademark AJICURE and by Air Products under the trademark AMICURE or ANCAMINE are especially preferred for use in the present invention.

Among the commercially available amine-epoxy adducts suitable for use in the present invention are Ajicure PN-H, Ajicure PN-23(J), Ajicure PN-40(J), Ajicure PN-50(J), Ajicure PN-31, Amicure 2014 AS, Amicure 2014 FG, Amicure 2337S, Amicure 2441, Amicure 2442, Ajicue MY-24, Ajicure MY-H, Ajicure MY-23, Adeka Hardener EH 4360S, Adeka Hardener EH 4370S, Adeka Hardener EH 3731S, and Adeka Hardener EH 4357S.

Combinations of different nitrogen-containing curatives, such as combinations of different amine-epoxy adducts are also desirable for use herein.

The at least one nitrogen-containing curative, such as the amine-epoxy adduct, may be present in the adhesive of the present invention in an amount in the range of about 5 to about 40 parts per weight, preferably in an amount in the range of about 8 to about 30 parts per weight, and more preferably in an amount in the range of about 10 to about 25 parts per weight, based on the total weight of all resin components of the adhesive of the present invention.

Depending on the chemical nature of the nitrogen-containing curative one-component-adhesives as well as two-component-adhesives having pot lives of five hours up to some months may be formulated.

The term "pot life" refers to the stability of the inventive adhesive formulation at 22° C. An inventive adhesive formulation is regarded as being stable as long as the viscosity increase of the inventive adhesive is less than 50% compared to the original viscosity of the adhesive formulation. All viscosities are determined under the same conditions.

As soon as the curing reaction is desired, the required heat or energy is incorporated into the mixture of the components, whereupon spontaneous curing occurs, which is finalized after about 0.1 s to 100 min, depending on the reactivity of the components selected.

The adhesive of the present invention further comprises at least one metal filler that has a melting point of less than 300° C. at 1013 mbar. Preferably the melting point of the at least one metal filler, determined at 1013 mbar, is less than 270° C., or less than 250° C., or less than 230° C., or less than 200° C., or less than 180° C., or less than 160° C.

For metal alloys the term "melting point" refers to the eutectic melting point of said metal alloy. If a metal alloy does not exhibit an eutectic melting point, the given melting point refers to the temperature at which the alloy is completely transformed into its liquids state.

The melting point of different metals or metal alloys can easily be determined by a person skilled in the art or can be found in the literature (e.g. Holleman-Wiberg, Lehrbuch der anorganischen Chemie, 101. Edition, de Gruyter, 1995).

In one embodiment of the present invention the metal filler is selected from indium (m.p. 157° C.), tin (m.p. 232° C.), and alloys of indium and/or tin, such as alloys of indium with silver, bismuth, tin and/or lead or alloys of tin with silver, bismuth, indium and/or lead.

The term "indium alloy" refers to alloys which comprise at least 5 percent by weight of Indium, based on the total amount of the alloy.

The term "tin alloy" refers to alloys which comprise at least 5 percent by weight of tin, based on the total amount of the alloy.

In a particular preferred embodiment the alloy of the present invention comprises at least 10 percent by weight of indium, preferably at least 20 percent by weight of indium and more preferably at least 30 percent by weight of indium, and/or at least 10 percent by weight of tin, preferably at least 20 percent by weight of tin and more preferably at least 30 percent by weight of tin, based on the total weight of the alloy.

Example of suitable alloys of indium and/or tin (in which wt. % means percent by weight) include SnPb (Sn 63 wt. %, Pb 37 wt. %, m.p. 183° C.), SnAg (Sn 96.5 wt. %, Ag 3.5 wt. %, m.p. 221° C.), SnIn (Sn 50 wt. %, In 50 wt. %, m.p. 120° C.), SnBi (Sn 5 wt. %, Bi 95 wt. %, m.p. 251° C.). BiInSn (Bi 32.5 wt. %, In 51 wt. %, Sn 16.5 wt. %, m.p. 62° C.), BiPbSn (Bi 50 wt. %, Pb 26.7 wt. %, Sn 13.3 wt. %, m.p. 70° C.), BiPbSn (Bi 25 wt. %, Pb 25 wt. %, Sn 50 wt. %, m.p. 100° C.), AgIn (Ag 10 wt. %, In 90 wt. %, m.p. 237° C.), InGa (In 99.3 wt. %, Ga 0.7 wt. %, m.p. 150° C.).

Combinations of different metal fillers that have a melting point of less than 300° C. at 1013 mbar are also desirable for use herein.

The addition of metal fillers that have a melting point of less than 300° C. at 1013 mbar, such as indium and/or alloys of indium, improve the long term stability of the electrically conductive bonds formed by the inventive adhesives, because said metal fillers prevent a significant increase in electrical resistivity, even under elevated temperature and/or high humidity conditions.

At least one metal filler having a melting point of less than 300° C. at 1013 mbar, such as indium, may be present in the adhesive of the present invention in an amount in the range of about 0.1 to about 40 parts per weight, preferably in an amount in the range of about 1 to about 10 parts per weight, and more preferably in an amount in the range of about 2 to about 5 parts per weight, based on the total weight of the inventive adhesive.

The adhesive of the present invention may further comprise at least one electrically conductive filler. The electrically conductive filler is different from the metal filler and is preferably selected from silver, copper, gold, palladium, platinum, carbon black, carbon fiber, graphite, aluminium, indium tin oxide, silver-coated copper, silver-coated aluminum, metallic-coated glass spheres, antimony-doped tin oxide, and combinations thereof. If present, the least one electrically conductive filler is preferably selected from silver. Combinations of different electrically conductive fillers are also desirable for use herein.

In one embodiment of the present invention at least one particulate electrically conductive filler that has a mean particle size in the range of 100 nm to 50 μm, preferably in the range of 5 μm to 30 μm, and more preferably in the range of 1 μm to 10 μm, is used. The particulate electrically conductive filler can have different shapes, such a spherical, flake-like and/or dendritical shapes.

As used herein, the term "mean particle size" preferably refers to the D50 value of the cumulative volume distribution curve at which 50% by volume of the particles have a diameter less than said value. The mean particle size or D50 value is measured in the present invention by laser diffractometry using a S3500 available from Microtrac Inc. In this technique, the size of particles in suspensions or emulsions is measured using the diffraction of a laser beam, based on application of either Fraunhofer or Mie theory. In the present invention, Mie theory or a modified Mie theory for non-spherical particles is applied.

The addition of nanoparticulate electrically conductive fillers that have a mean particle size in the range of 10 nm to 100 nm generally increase the bulk electrical conductivity of the resin component, while maintaining a viscosity that allows relatively easy processing and manipulation. Furthermore, nanoparticulate electrically conductive fillers can penetrate into surface pores and irregularities inaccessible to micron-sized electrically conductive fillers, thereby reducing the effects on interfacial resistance. The presence of nanoparticulate electrically conductive fillers in the present formulation may also improve the stability of the adhesive when micron-sized particles are present. The at least one electrically conductive filler, such as silver, may be present in the adhesive of the present invention in an amount in the range of about 40 to about 95 percent by weight, preferably in an amount in the range of about 50 to about 90 percent by weight, and more preferably in an amount in the range of about 70 to about 85 percent by weight, based on the total weight of the adhesive of the present invention. In another embodiment the adhesive of the present invention further comprises typical additives known in the art such as plasticizers, oils, stabilizers, antioxidants, pigments, dyestuffs, polymeric additives, defoamers, preservatives, thickeners, rheology modifiers, humectants, masterbatches, adhesion promoters, dispersing agents, and water. When used, additives are used in an amount sufficient to provide the desired properties. At least one additive may be present in the inventive adhesive in an amount in the range of about 0.05 to about 10 percent by weight, preferably in an amount in the range of about 1 to about 5 percent by weight, and more preferably in an amount in the range of about 2 to about 4 percent by weight, based on the total weight of the inventive adhesive. Combinations of different additives are also desirable for use herein.

One typical formulation of the inventive adhesive comprises:
- a) i) from 25 to 55 percent by weight of at least one cyanate ester component, based on the total weight of all resin components;
- a) ii) from 45 to 75 percent by weight of at least one epoxy resin, based on the total weight of all resin components;
- b) from 5 to 40 parts per weight of at least one nitrogen-containing curative, based on the total weight of all resin components;
- c) from 0.1 to 40 percent by weight of at least one metal filler, which has a melting point of less than 300° C. at 1013 mbar, based on the total weight of the inventive adhesive;
- d) from 0 to 95 percent by weight of at least one electrically conductive filler, which is different from the metal filler, based on the total weight of the inventive adhesive;
- e) from 0 to 35 parts per weight of at least one core shell rubber, based on the total weight of all resin components; and
- f) from 0 to 10 percent by weight of at least one additive, based on the total weight of the inventive adhesive, wherein the proportion of the resin components a i), a ii) and b) is in the range of 3 to 22 percent by weight, based on the total weight of the inventive adhesive.

One preferred formulation of the inventive adhesive comprises:
- a) i) from 2 to 8 percent by weight of at least one cyanate ester component;
- a) ii) from 3 to 10 percent by weight of at least one epoxy resin;
- b) from 1.5 to 3 percent by weight of at least one amine-epoxy adduct;
- c) from 1.5 to 3 percent by weight of indium;
- d) from 70 to 90 percent by weight of silver;
- e) from 0 to 5 percent by weight of at least one core shell rubber; and
- g) from 0 to 5 percent by weight of at least one additive, wherein the quantity of each component is based on the total weight of the inventive adhesive.

The inventor of the present invention found that the aforementioned formulations can be used as adhesives, which simultaneously exhibit a high peel strength, a high curing speed, a high electrical conductivity, a stable electrical contact resistance (long term stability) and a low bulk conductivity.

The inventive adhesive, which is an electrically conductive adhesive, can find use as lead-free solder replacement technology, general interconnect technology, die attach adhesive, and so forth. Electronic devices, integrated circuits, semiconductor devices, solar cells and/or solar modules and other devices employing the present adhesive may be used in a wide variety of applications throughout the world, including energy production, personal computers, control systems, and telephone networks.

In a particular preferred application the adhesive of the present invention is used to replace soldered or welded interconnections in solar cells and/or solar cell modules. These solar cells/modules both include but are not limited to cells and modules based on crystalline silicon (c-Si) cells as well as the so called thin film solar modules where the active photovoltaic layer can comprise CI(G)S (Copper Indium Selenide or sulphide, $CuInSe_2$ or $CuInS_2$, Copper Indium Gallium Selenide or Sulfide, CuInGaSe or CuInGaS), cadmium telluride (CdTe), a-Si, µ-Si or combinations thereof). Normally contact tabs, such as tin, tin lead, tin lead silver or tin silver coated copper tabs are mounted on a solar cell/module for interconnection to an external electrical circuit. Soldering of the contact tabs to the solar cells/modules results in a rigid interconnection and residual stresses due to thermal expansion coefficient mismatch between the silicon-made solar cell/module and the solder. During manufacturing and service the temperature cycles seen by the interconnection will result in damage to the solar cells and/or solar cell modules.

In this context the inventive adhesives can be used as a lead-free alternative to solder. The lower processing temperature of the inventive adhesive, as compared to soldering, results in a lower residual stress after cooling to room temperature. Conventional lead-containing soldering occurs at temperatures around 220° C. and conventional non-lead-containing soldering occurs at temperatures above 220° C., whereas the inventive adhesive can be cured during or prior to lamination at temperatures well below 220° C.

When cured, the cured product of the adhesive forms a stable interconnection between the contact tab and the surface of the solar cell and/or solar modules, wherein said interconnection provides a high mechanical strength, a stable electrical contact resistance, and a high electrical conductivity.

Therefore the cured product of the inventive adhesive is another aspect of the present invention. As noted above, the adhesive of the present can be cured in about 0.1 s to 100 minutes at a temperature within the range of about 50° C. to about 220° C., 90° C. to about 180° C., or 120° C. to about 150° C.

In a preferred embodiment the inventive adhesive is cured at 120° C. to 150° C. in less than 5 s, preferably less than 4 s, and more preferably less than 3 s. The curing of the inventive adhesive can be performed by heating the formulation, e.g. by using IR lamps or conventional heating techniques.

Another aspect of the present invention is a bonded assembly comprising two substrates aligned in a spaced apart relationship, each of which having an inwardly facing surface and an outwardly facing surface, wherein between the inwardly facing surfaces of each of the two substrates an electrically conductive bond is formed by the cured product of the inventive adhesive.

At least one of the substrates can be selected from metals, such as metal firing pastes, aluminum, tin, molybdenum, silver, and conductive metal oxides such as indium tin oxide (ITO), fluorine doped tin oxide, aluminum doped zinc oxide etc. Further suitable metals include copper, gold, palladium, platinum, aluminium, indium silver coated copper, silver coated aluminum, tin, and tin coated copper.

The silicon substrate can be crystalline or amorphous. Crystalline silicon can be selected from monocrystalline or multicrystalline silicon. Monocrystalline silicon is produced by slicing wafers from a high-purity single crystal boule, whereas multicrystalline silicon is made by sawing a cast block of silicon first into bars and then into wafers.

In particular preferred embodiment one substrate is made from a metal firing paste typically used on a crystalline silicon solar cell/module or a transparent conductive oxide, such as indium tin oxide and the other substrate is made from tin coated copper, tin silver coated copper or silver coated copper.

The term "firing paste" as used in the present invention generally refers to a thick film composition which comprises a functional phase that imparts appropriate electrically functional properties to the composition. The functional phase comprises electrically functional powders dispersed in an organic medium that acts as a carrier for the functional phase that forms the composition. The composition is fired to burn out the organic phase, activate the inorganic binder phase and impart the electrically functional properties.

A further aspect of the present invention relates to the use of the adhesive of the present invention in the fabrication of electronic devices, integrated circuits, semiconductor devices, and solar cells.

By using metal fillers having a melting point of less than 300° C. at 1013 mbar, such as indium, the long term stability of the electrically conductive bonds formed by the electrically conductive adhesives can be improved, because said metal fillers prevent that a significant increase in the electrical resistivity occurs in said bonds.

This invention is further illustrated by the following representative examples.

EXAMPLES

The following materials were used:
Cyanate ester component: 4,4'-ethylidenediphenyldicyanate (Primaset Lecy from Lonza)
Epoxy resin 1: Diglycidyl ether of bisphenol F
Epoxy resin 2: 1,4-butanediol diglycidiyl ether from Acros
Nitrogen-containing
curative: Nitrogen-containing compound in form of an epoxy adduct as described in the present invention
Core shell rubber
particles: Core shell rubber particles as described in the present invention
Indium: Type 6A 625 mesh from AM&M
Silver: Micron-sized silver flakes As shown below in Table 1 different samples were prepared. Sample No. 1 and sample No. 3 are control samples. Sample No. 1 is a comparable formulation to sample No. 2 but does not comprise indium. Sample No. 3 is a commercially available epoxy-based electrically conductive adhesive (ECCOBOND CE3103WLV), which does not comprise a cyanate ester component.

TABLE 1

| | Sample No. [wt. %] | |
|---|---|---|
| Components | 1 (Ref.) | 2 |
| Cyanate ester component | 5.68 | 5.57 |
| Epoxy resin 1 | 4.79 | 4.70 |
| Epoxy resin 2 | 2.13 | 2.09 |
| Nitrogen-containing curative | 2.13 | 2.09 |
| Core shell rubber particles | 1.60 | 1.56 |
| Indium | — | 2.00 |
| Silver | 83.66 | 82.00 |
| Total | 100 | 100 |

Each of the samples No. 1 and No. 2 was prepared as follows:

The epoxy resins 1 and 2 were added to the cyanate ester component and the resulting mixture was stirred in a speed-mixer container at a temperature of 22° C. for a period of time of 2 minutes at a mix speed of 2000 rpm.

The remaining components were added and the resulting formulation was stirred at a temperature of 22° C. for a period of time of 1 minute at a mix speed of 1000 rpm until a substantially homogeneous formulation was observed to form.

The following methods were used to further characterize the different samples (adhesives) of the present invention:
Electrical Contact Resistance The electrical contact resistance was determined (TLM structure test setup) by attaching silver coated copper contact tabs to a test layer of indium tin oxide or by attaching tin coated copper contact tabs to a front bus bar (silver firing paste) of a c-Si solar cell. A TLM structure was obtained by contacting 7 contact tabs to the test layer, wherein the contact tabs exhibit increasing distances between the contact tabs going from about 3 mm to about 18 mm. The resistance between the neighbouring contact tabs was measured by a Keithley 2010 multimeter and plotted as a function of the distance. The contact resistance value is the half of the intercept from the curve obtained from that plot.
Stable Electrical Contact Resistance The stability of the electrical contact resistance was determined by accelerated ageing testing (85° C., relative humidity of 85%) using the TLM test setup as described above.

After 4000 h the electrical contact resistance is increased by less than 20%, based on the initial electrical contact resistance, indicated by "+" in the following table.

After 4000 h the electrical contact resistance is increased by more than 20%, based on the initial electrical contact resistance, indicated by "−" in the following table.
Peel Strength The peel strength was determined by adhering a metal tab (2 mm wide, 150 micron thick, SnAg coated Cu tabs) to a ceramic substrate of 10×10 cm. The adhesive was printed down five times on the ceramic substrate by using a stencil (dimension of 2×5×0.75 mm) to create five adhesion spots. After placing the metal tab on the five adhesion spots the assembly was cured in a box oven at 150° C. for 10 minutes. Samples were left for at least two hours at room temperature before the peel strength was determined using a 90° peel test equipment from Frolyt. For all reported peel strength values, a peel speed of 8.8 mm/sec was used. The results reported are the average of 15 samples (three metal tabs, five adhesion spots for each metal tab).
Viscosity The viscosities were measured at 25° C. using an AR 1000 rheometer from TA instruments. For the measurement, a 2 cm plate geometry and a 200 micron gap was used. The shear rate applied was 15 $s^{-1}$.

Table 2 shows the different properties of samples No. 1 to No. 3.

TABLE 2

| | Sample No. [wt. %] | | |
|---|---|---|---|
| Properties | 1 (Ref.) | 2 (Inv.) | 3 (Ref.) |
| Electrical contact resistance on ITO [Ohm][2] | 1.76 | 1.36 | 0.58 |
| Stable electrical contact resistance on ITO[1] | − | + | + |
| Electrical contact resistance on Ag firing paste [mOhm][3] | 7.86 | 7.33 | 10.9 |
| Stable electrical contact resistance on Ag firing paste[1] | − | + | − |
| Peel Strength [N/2 mm] | 2.3 | 2.4 | 1.0 |
| Viscosity [Pa · s] | 24.97 | 25.96 | 23.97 |

[1]+ After 4000 h storage in 85° C./85% RH, the electrical contact resistance is increased by less than 20%, based on the initial electrical contact resistance.
− After 4000 h storage in 85° C./85% RH, the electrical contact resistance is increased by more than 20%, based on the initial electrical contact resistance.
[2]on contact area of 2 mm × 20 mm
[3]on contact area of 2 mm × 2 mm The cure speed of sample No. 3 was 5 minutes at 150° C. whereas sample No. 1 and No. 2 were cured in less than 5 seconds at 150° C.

I claim:

1. A bonded assembly comprising:
two substrates aligned in a spaced apart relationship, each of which having an inwardly facing surface and an outwardly facing surface, wherein between the inwardly facing surfaces of each of the two substrates an electrically conductive bond is formed by a cured electrically conductive adhesive, consisting of:
a) a resin component consisting of:
  i) 2 to 8% by weight of a cyanate ester component selected from polyfunctional monomeric cyanates, polyfunctional polymeric cyanates, and combinations thereof, and
  ii) 3 to 10% by weight of an epoxy resin;
b) 1.5 to 3% by weight of at least one nitrogen-containing curative selected from amine-epoxy adducts;
c) 1.5 to 3% by weight of indium;
d) 70 to 90% by weight of silver flakes;
e) core shell rubber particles; and
f) optionally one or more additives selected from the group consisting of oils, pigments, dyes, defoamers, thickeners, humectants, dispersing agents, and water;
wherein the quantity of each of a)-f) is based on the total weight of the adhesive, wherein the adhesive is cured between 90° C. to 150° C. in 0.1 to 5 seconds.

2. The bonded assembly according to claim 1, wherein the epoxy resin is selected from monofunctional glycidyl ethers, polyfunctional glycidyl ethers, and combinations thereof.

3. The bonded assembly according to claim 2, wherein the cyanate ester component is 4,4'-ethylidenediphenyldicyanate.

4. The bonded assembly according to claim 1, wherein upon exposure to an accelerated aging test of 4000 hours of 85° C. and relative humidity of 85%, the electrical contact resistance of the adhesive is increased by less than 20%, based on the initial electrical contact resistance.

5. A bonded assembly comprising:
two substrates aligned in a spaced apart relationship, each of which having an inwardly facing surface and an outwardly facing surface, wherein between the inwardly facing surfaces of each of the two substrates an electrically conductive bond is formed by a cured electrically conductive adhesive consisting of:
a) a resin component consisting of:
  i) 2 to 8% by weight of a cyanate ester component selected from polyfunctional monomeric cyanates, polyfunctional polymeric cyanates, and combinations thereof, and
  ii) 3 to 10% by weight of an epoxy resin;
b) 1.5 to 3% by weight of at least one nitrogen-containing curative selected from amine-epoxy adducts;
c) 1.5 to 3% by weight of indium;
d) 70 to 90% by weight of silver flakes; and
e) core shell rubber particles;
wherein the quantity of each of a)-e) is based on the total weight of the adhesive, wherein the adhesive is cured between 90° C. to 150° C. in 0.1 to 5 seconds.

6. A bonded assembly comprising:
a solar cell;
an external electrical circuit comprising contact tabs;
a lead free electrically conductive adhesive laminating together the solar cell and the contact tabs, the adhesive consisting of:
a) a resin component consisting of:
  i) 2 to 8% by weight of a cyanate ester component selected from polyfunctional monomeric cyanates, polyfunctional polymeric cyanates, and combinations thereof, and
  ii) 3 to 10% by weight of an epoxy resin;
b) 1.5 to 3% by weight of at least one nitrogen-containing curative selected from amine-epoxy adducts;
c) 1.5 to 3% by weight of indium;
d) 70 to 90% by weight of silver flakes; and
e) core shell rubber particles;
wherein the quantity of each of a)-e) is based on the total weight of the adhesive, and wherein the adhesive is cured between 90° C. to 150° C. in 0.1 to 5 seconds.

7. An electrically conductive adhesive consisting of:
a) a resin component consisting of:
  i) 2 to 8% by weight of a cyanate ester component selected from polyfunctional monomeric cyanates, polyfunctional polymeric cyanates, and combinations thereof, and
  ii) 3 to 10% by weight of an epoxy resin;
b) 1.5 to 3% by weight of at least one nitrogen-containing curative selected from amine-epoxy adducts;
c) 1.5 to 3% by weight of indium and/or indium alloys;
d) 70 to 90% by weight of silver flakes; and
e) optionally one or more additives selected from the group consisting of oils, pigments, dyes, defoamers, thickeners, humectants, dispersing agents, and water;
wherein the quantity of each of a)-e) is based on the total weight of the adhesive, wherein the adhesive is curable between 90° C. to 150° C.

8. The electrically conductive adhesive according to claim 7, wherein the epoxy resin is selected from monofunctional glycidyl ethers, polyfunctional glycidyl ethers, and combinations thereof.

9. The electrically conductive adhesive according to claim 8, wherein the cyanate ester component is 4,4'-ethylidenediphenyldicyanate.

10. The electrically conductive adhesive according to claim 7, wherein upon exposure to an accelerated aging test of 4000 hours of 85° C. and relative humidity of 85%, the electrical contact resistance of the adhesive is increased by less than 20%, based on the initial electrical contact resistance.

* * * * *